US009590359B1

(12) United States Patent
Patterson et al.

(10) Patent No.: US 9,590,359 B1
(45) Date of Patent: Mar. 7, 2017

(54) COAXIAL ELECTRICAL INTERCONNECT

(71) Applicant: Raytheon Company, Waltham, MA (US)

(72) Inventors: Chad Patterson, Marina Del Rey, AZ (US); Duke Quach, San Gabriel, CA (US); Ethan S. Heinrich, San Pedro, CA (US); Michael M. Fitzgibbon, Playa Del Rey, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/872,001

(22) Filed: Sep. 30, 2015

(51) Int. Cl.
*H01R 24/00* (2011.01)
*H01R 13/6473* (2011.01)
*H01R 12/75* (2011.01)

(52) U.S. Cl.
CPC ......... *H01R 13/6473* (2013.01); *H01R 12/75* (2013.01)

(58) Field of Classification Search
CPC ............ H01R 13/2421; H01R 13/2428; H01R 2103/00; H01R 24/40; H01R 24/38; H01R 24/52; H01R 11/18; H01R 11/24; G01R 1/06788; G01R 1/07314
USPC .......................... 439/675, 219, 482, 700, 824
See application file for complete search history.

(56) References Cited

U.S. PATENT DOCUMENTS

| | | | |
|---|---|---|---|
| 5,009,613 A * | 4/1991 | Langgard ........... | G01R 1/06722 439/482 |
| 5,233,290 A * | 8/1993 | Swart ..................... | G01R 1/067 200/61.76 |
| 5,458,500 A * | 10/1995 | Aikawa ................ | G01R 31/045 439/310 |
| 5,618,205 A | 4/1997 | Riddle et al. | |
| 6,366,185 B1 | 4/2002 | Keesey et al. | |
| 6,958,670 B2 | 10/2005 | Winslow et al. | |
| 7,344,418 B2 * | 3/2008 | Xu ..................... | H01R 13/2421 439/700 |
| 8,690,583 B2 * | 4/2014 | Uesaka ................ | H01R 12/714 439/63 |

FOREIGN PATENT DOCUMENTS

| | | |
|---|---|---|
| EP | 2533374 A1 | 12/2012 |
| GB | 1214034 | 11/1970 |
| WO | WO 2010/042926 | 4/2010 |

OTHER PUBLICATIONS

Micro-Mode, Bullets (Interconnects), http://micromode.com/product-category/blindmates-connectors/bullets?filter_series=msss, date accessed is prior to the application filing date, 4 pages.

* cited by examiner

*Primary Examiner* — Hien Vu

(57) ABSTRACT

A coaxial electrical interconnect is disclosed. The coaxial electrical interconnect can include an inner conductor including an electrically conductive spring probe. The coaxial electrical interconnect can also include an outer conductor including a plurality of electrically conductive spring probes disposed about the inner conductor. Each spring probe can have a barrel and a plunger biased out of the barrel. The plunger can have a first plunger portion external to the barrel and a second plunger portion disposed partially in the barrel. The first and second plunger portions can have different diameters. A barrel of the spring probe of the inner conductor can be located proximate a plunger of at least one of the spring probes of the outer conductor.

13 Claims, 7 Drawing Sheets

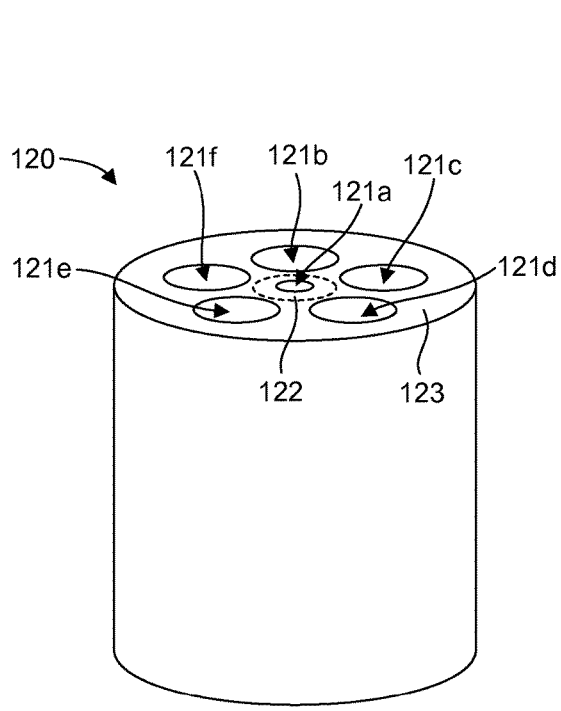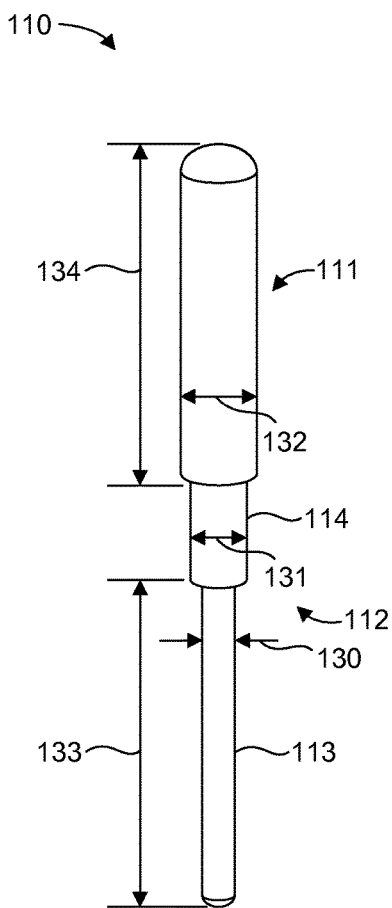
*FIG. 2*
*FIG. 3*

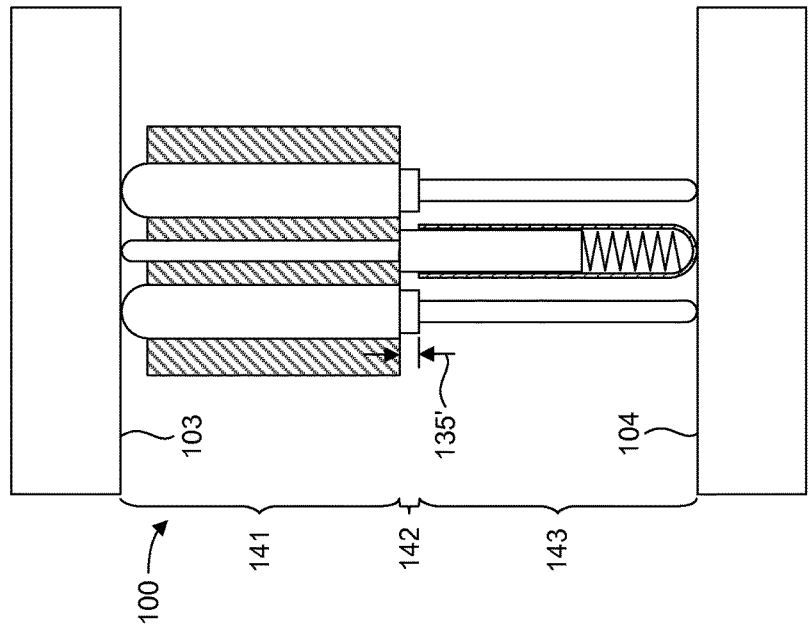
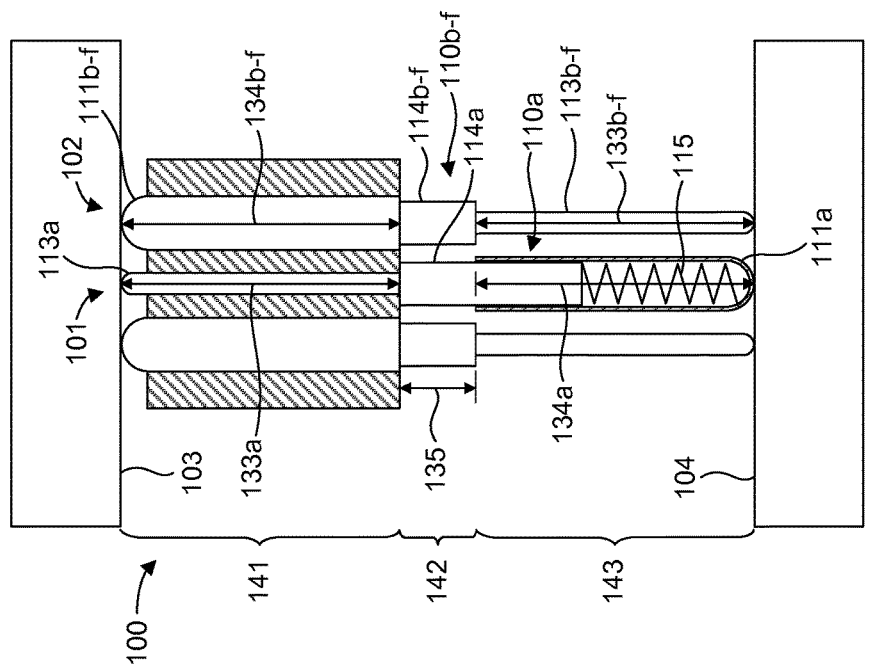
FIG. 4B
FIG. 4A

COAXIAL ELECTRICAL INTERCONNECT

BACKGROUND

Some electrical circuits, particularly radio frequency (RF) circuits, are impedance matched and therefore efforts are taken to provide a given characteristic impedance through connecting cables and electrical interconnects that couple various components of the circuits. Often, electrical interconnects are utilized to electrically couple adjacent circuit boards to one another. However, the spacing between such circuit boards can vary. Accordingly, spring probes, which can compress to vary in length, are typically used to electrically connect such circuit boards.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 2 is a support member of the coaxial electrical interconnect of FIG. 1.

FIG. 3 is a spring probe of the coaxial electrical interconnect of FIG. 1.

FIG. 4A is a cross-sectional view of the coaxial electrical interconnect of FIG. 1 in an uncompressed configuration.

FIG. 4B is a cross-sectional view of the coaxial electrical interconnect of FIG. 1 in a compressed configuration.

Figure 1:
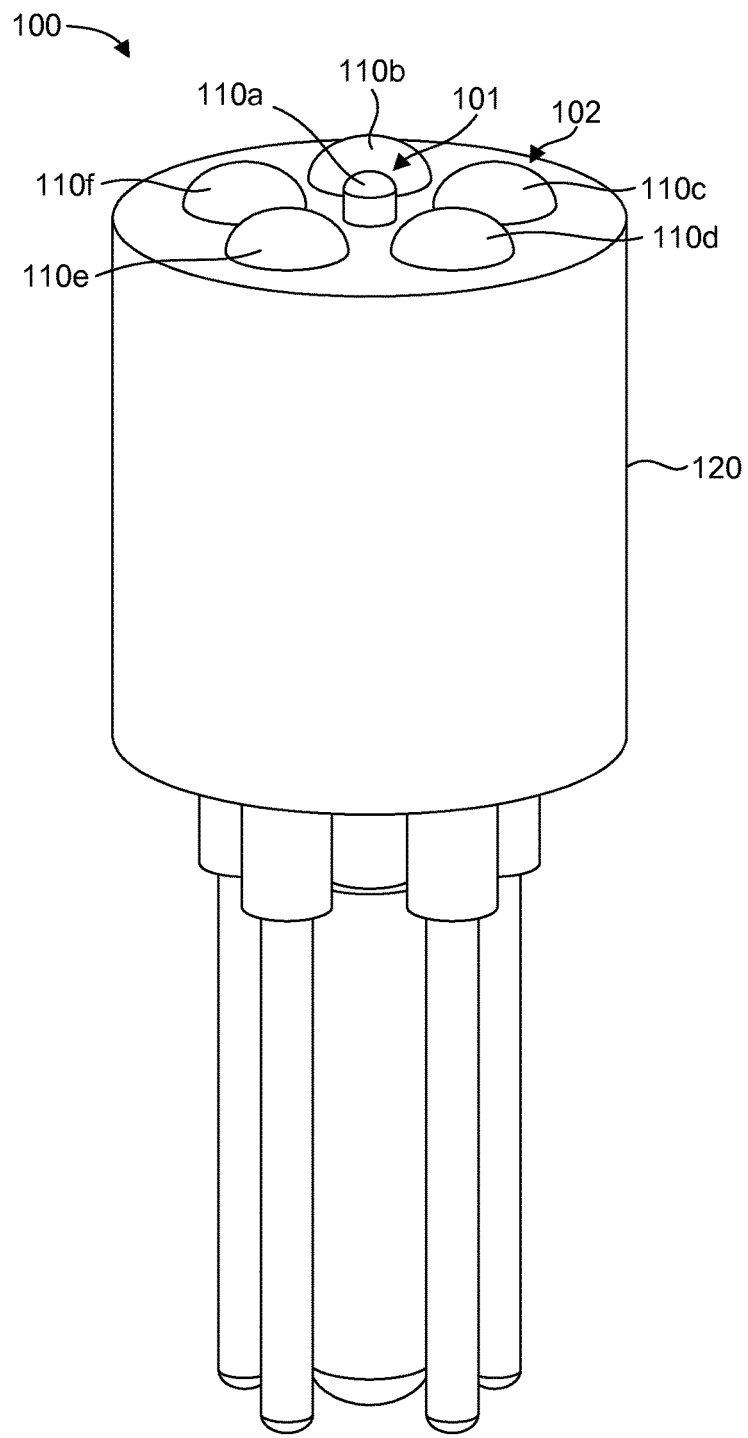
FIG. 1 is a coaxial electrical interconnect in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Conventional coaxial interconnects, using spring probes, have varying impedance mismatch dependent on the amount of compression of the spring probes. When large compression variability is required, very large impedance mismatch can occur. In some cases, impedance mismatch due to the electrical interconnect may require significant on-board matching. It is therefore highly desirable to have a coaxial electrical interconnect that can compress to vary in length while maintaining a constant characteristic impedance independent of the amount of compression of the electrical interconnect.

Accordingly, a coaxial electrical interconnect is disclosed that can compress to vary in length and maintain a characteristic impedance regardless of the amount of compression. The coaxial electrical interconnect can include an inner conductor including an electrically conductive spring probe. The coaxial electrical interconnect can also include an outer conductor including a plurality of electrically conductive spring probes disposed about the inner conductor. Each spring probe can have a barrel and a plunger biased out of the barrel. The plunger can have a first plunger portion external to the barrel and a second plunger portion disposed at least partially in the barrel. The first and second plunger portions can have different diameters. A barrel of the spring probe of the inner conductor can be located proximate a plunger of at least one of the spring probes of the outer conductor.

In addition, an electrically conductive spring probe for a coaxial electrical interconnect is disclosed. The electrically conductive spring probe can include a barrel and a plunger biased out of the barrel. The plunger can have a first plunger portion external to the barrel and a second plunger portion disposed partially in the barrel. The first and second plunger portions can have different diameters.

One example of a coaxial electrical interconnect 100 is illustrated in FIG. 1. The coaxial electrical interconnect 100 can be used as an RF interconnect to accommodate variations in distance between adjacent electrically coupled components (e.g., circuit boards) by being compressible in length. A characteristic impedance of the coaxial electrical interconnect 100 can be maintained substantially constant as the length of interconnect varies, as described further below, which is highly desirable in impedance matched circuits.

The coaxial electrical interconnect 100 can comprise an inner conductor 101 and an outer conductor 102, which can be used for signal and ground connections, respectively. The inner conductor 101 can include at least one electrically conductive spring probe 110a and the outer conductor 102 can include a plurality of electrically conductive spring probes 110b-f disposed about the inner conductor 101. As shown, the spring probes 110b-f of the outer conductor 102 can be disposed in a circular configuration about the spring probe 110a of the inner conductor 101. It should be recognized that the inner conductor 101 and the outer conductor 102 can each include any suitable number of spring probes.

It should also be recognized that although the spring probes 110b-f of the outer conductor 102 are shown disposed in a circular configuration about the spring probe 110a of the inner conductor 101, the spring probes 110b-f of the outer conductor 102 can be disposed in any suitable configuration (e.g., shape) about the spring probe 110a of the inner conductor 101.

The coaxial electrical interconnect 100 can also comprise a spring probe support member 120 configured to provide mechanical support for the spring probes 110a-f of the inner and outer conductors 101, 102. The spring probe support member 120 is shown isolated in FIG. 2 and a representative spring probe 110 is shown isolated in FIG. 3.

In general, as shown in FIG. 3, the spring probe 110 can have a barrel 111 and a plunger 112 disposed at least partially in an opening or cavity of the barrel and biased out of the barrel 111. The plunger 112 can have a first plunger portion 113 external to the barrel 111 and a second plunger portion 114 disposed partially in the barrel 111. The first and second plunger portions 113, 114 have different diameters 130, 131, respectively, which are also different from a diameter 132 of the barrel 111. The first plunger portion 113 can have a length 133 and the barrel 111 can have a length 134. In one aspect, discussed in more detail below, the length 133 of the first plunger portion 113 and the length 134 of the barrel 111 can be substantially the same, which when combined with other similar spring probes in a coaxial electrical interconnect can facilitate, at least in part, maintaining a characteristic impedance of the electrical interconnect as the plungers move relative to the barrels to accommodate variations in distance between adjacent electrically coupled components.

The spring probe support member 120 can include openings to receive portions of the spring probes. For example, as shown in FIG. 2, the spring probe support member 120 can include an opening 121a to receive the first plunger portion 113a of the spring probe 110 and openings 121b-f to receive the barrels 111b-f of the spring probes 110b-f. The spring probe support member 120 is shown as having a cylindrical configuration but any suitable configuration may be utilized.

As shown in FIG. 1, the spring probe 110a of the inner conductor 101 can be inverted relative to the spring probes 110b-f of the outer conductor 102. Thus, in one aspect, the barrel of the spring probe 110a of the inner conductor 101 can be located proximate one or more plungers of the spring probes 110b-f of the outer conductor 102. Similarly, the plunger of the spring probe 110a of the inner conductor 101 can be located proximate one or more barrels of the spring probes 110b-f of the outer conductor 102. In addition, the spring probe support member 120 can be engaged with the first plunger portion of the spring probe 110a of the inner conductor 101 and with the barrels of the spring probes 110b-f of the outer conductor 102. In one aspect, the spring probes 110a-f of the inner and outer conductors 101, 102 can be substantially identical, although the springs probes of an electrical interconnect as disclosed herein can include spring probes that are different from one another.

The support member 120 can be constructed of any suitable material or combination of materials, which may include a dielectric material (e.g., a suitable polymer). In one aspect, the support member 120 can be constructed entirely of a dielectric material. In another aspect, illustrated in FIG. 2, the support member 120 can be made of a dielectric material (indicated by reference number 122) around the opening 121a for the inner spring probe 110a. In addition, the support member 120 can have a conductive material (indicated by reference number 123) on the outside or periphery of the support member 120 that is at least partially in communication with the openings 121b-f to electrically connect the outer spring probes 110b-f to the same electrical potential.

With continued reference to FIGS. 1-3, FIGS. 4A and 4B illustrate schematic cross-sectional views of the coaxial electrical interconnect 100 in an uncompressed configuration (FIG. 4A) and a compressed configuration (FIG. 4B), such when establishing an electrical connection between two adjacent circuit boards 103, 104. The spring probe of the inner conductor 101 is referred to by reference no. 110a and the spring probes of the outer conductor 102 are referred to collectively by reference nos. 110b-f. The spring probes 110a-f of the coaxial electrical interconnect 100 can provide a certain range of motion or travel to accommodate variations in distance or stack-up of the adjacent circuit boards 103, 104. Thus, in one aspect, each spring probe 110a-f can include a spring to bias the plunger out of the barrel and accommodate compression of the plunger into the barrel, as illustrated by a spring 115 of the spring probe 110a. The spring-loaded probes can provide a reliable electrical contact between electrical components that may be located at a variable or unknown distance from one another. The configuration of the spring probes 110a-f can provide any suitable range of motion or travel to accommodate a given maximum variation in distance between electrical components. The ends of the spring probes 110a-f in contact with the circuit boards 103, 104 can be electrically coupled to the circuit boards in any suitable manner, such as by spring force or by soldering if a fixed connection is desired. In one aspect, no shrouds are needed for electrical purposes, but shrouds can be used for mechanical reasons, such as to provide protection and/or support.

In one aspect, the length 130a of the first plunger portion 113a of the spring probe 110a of the inner conductor 101 and the lengths 134b-f of the barrels 111b-f of the spring probes 110b-f of the outer conductor 102 can be equal or substantially equal in length. Similarly, the length 133b-f of the first plunger portions 113b-f of the spring probes 110b-f of the outer conductor 102 and the length 134a the barrel 111a of the spring probe 110a of the inner conductor 101 can be equal or substantially equal in length. As explained below, providing the first plunger portions 113a-f and the barrels 111a-f with substantially equal lengths can facilitate maintaining a characteristic impedance of the electrical interconnect 100 as the plungers 112a-f move relative to the barrels 111a-f.

The coaxial electrical interconnect 100 can also be divided into several regions, as a first region 141, a second region 142, and a third region 143, which can each have a nominal characteristic impedance. Such nominal characteristic impedances can be the same for all regions or they may vary from one another, as desired. The first region 141 of the electrical interconnect 100 can include the first plunger portion 113a of the spring probe 110a of the inner conductor 101 and the barrels 111b-f of the spring probes 110b-f of the outer conductor 102. The second region 142 of the electrical interconnect 100 can include the second plunger portions 114a-f of the spring probes 110a-f of the inner and outer conductors 101, 102 that are exposed or external to the barrels 111a-f. The third region 143 of the electrical interconnect 100 can include the barrel 111a of the spring probe 110a of the inner conductor 101 and the first plunger portions 113b-f of the spring probes 110b-f of the outer conductor 102. Note that the length of the second region 142 changes as the coaxial electrical interconnect 100 is compressed (e.g., from length 135 in FIG. 4A to a shorter length 135' in FIG. 4B). Because the second plunger portions 114a-f are partially disposed in the barrels 111a-f and move in and out of the barrels depending on the amount of compression of the coaxial electrical interconnect 100, the second region 142 is the only one of the three regions in FIGS. 4A and 4B that undergoes a change in length as the interconnect 100 is compressed. Thus, the lengths of the first and third regions 141, 143 are unaffected by compression of the interconnect 100, while the second region 142 adjusts in length for the amount of compression.

Figure 5A:
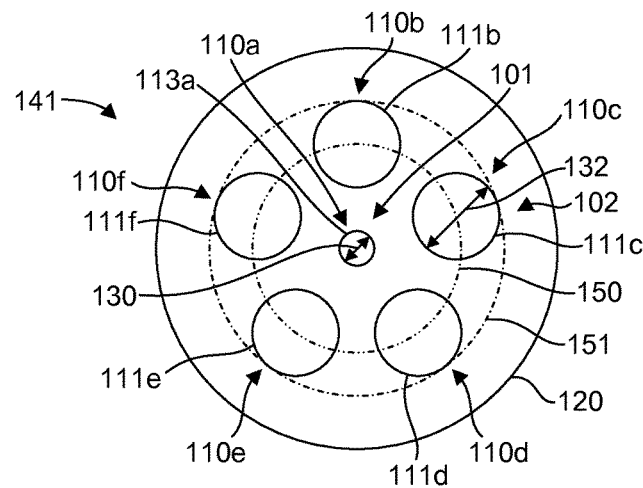
FIG. 5A-5C illustrate cross-sections of different regions of the coaxial electrical interconnect of FIG. 1, in accordance with examples of the present disclosure.
Figure 5B:
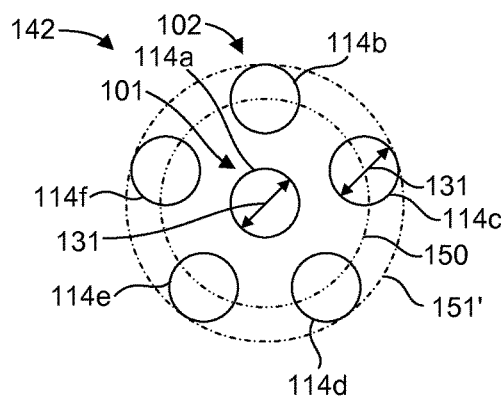
Figure 5C:
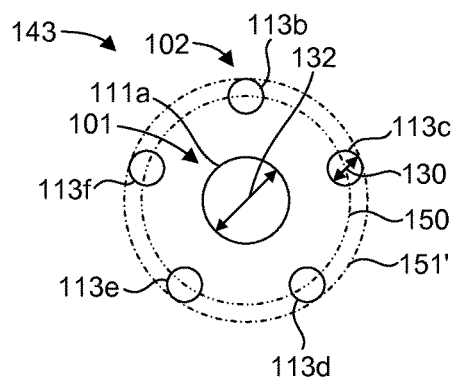

Viewed in cross-section in FIGS. 5A-5C, the first region 141, the second region 142, and the third region 143, respectively, can each be configured to provide a given characteristic impedance. Generally, characteristic impedance is determined by the geometry and materials of the electrical interconnect. In this case, characteristic impedance of each region 141-143 can be calculated using the diameters of the inner conductor 101 and the outer conductor 102, as well as accounting for a support structure (e.g., the spring probe support member 120) of the electrical interconnect where applicable. In one aspect, the material of the spring probe support member 120 can be used to tune the characteristic impedance of the region in which it resides (i.e., the first region 141 in this example). A support structure can interface with components of the first, second, and/or third regions as desired. The spring probe 110a of the inner conductor 101 is shown located at the center of a circular arrangement of the spring probes 110b-f. The centers or longitudinal axes of the spring probes 110b-f lie on a circle 150, which remains the same diameter and at the same location relative to the spring probe 110a for each region 141-143 because the spring probes 110b-f are parallel to one another, although other configurations are possible. A circle 151, 151', 151" of FIGS. 5A-5C, respectively, bounds the spring probes 110b-f and defines a diameter of the outer conductor 102 for each region 141-143.

Due to the relationship of the diameter 130 for the first plunger portions 113a-f, the diameter 131 for the second plunger portions 114a-f and, the diameter 132 for the barrels 111a-f, the diameters of the circles 151, 151', 151" (i.e., the diameters of the outer conductor 102) decrease from the first region 141 to the third region 143 while the diameters of the inner conductor 101 increase from the first region 141 to the third region 143. This inverse relationship in effective diameters of the inner and outer conductors 101, 102 from the first region 141 to the third region 143 can be utilized to configure the characteristic impedances for each region such that the characteristic impedances are equal across the regions. Thus, for the first region 141, where there is crowding in the outer conductor 102 due to the relatively large diameter of the barrels 111b-f, the diameter of the inner conductor 101 is at its smallest (e.g., the diameter of the first plunger portion 110a). This configuration of the first region 141, when accounting for the presence of the support member 120 material, which may be a dielectric material (e.g., a suitable polymer), can provide a characteristic impedance that is equal to the characteristic impedance of the second region 142 where the crowding in the outer conductor is reduced as the diameter of the inner conductor increases, and equal to the characteristic impedance of the third region 143 where the crowding in the outer conductor is reduced even further as the diameter 132 of the inner conductor 101 increases even more. Thus, the coaxial electrical interconnect inner and outer diameters 101, 102 can change with each of the regions 141-143 while maintaining a consistent or constant characteristic impedance across the regions. The spring probes 110a-f of the inner and outer conductors 101, 102 can be sized and positioned relative to one another to provide given characteristic impedances for the first, second, and third regions 141-143 and/or the coaxial electrical interconnect 100 as a whole. It should be recognized that identical spring probes can be utilized throughout the interconnect 100 or interconnect 100 can incorporate different spring probes, which may have different diameters for the barrels, and plunger portions.

As mentioned with regard to FIGS. 4A and 4B, because the lengths of the first and third regions 141, 143 are unaffected by compression of the interconnect 100, these regions will maintain the same characteristic impedance during compression of the interconnect 100. Furthermore, because the second region 142 merely changes in length (e.g., from length 135 to length 135') while the cross-section illustrated in FIG. 5B remains the same, the characteristic impedance of the second region will also be maintained during compression of the interconnect 100. Thus, the second region 142 can adjust in length for the amount of compression of the interconnect 100 without altering the characteristic impedance of the second region 142. In other words, the characteristic impedance of the interconnect 100 can be maintained substantially constant or stable throughout the range of travel of the spring probes 110a-f. As a result, compression of the interconnect 100 can have a minimal effect on impedance mismatch over a wide frequency band. The interconnect 100 can therefore provide for a high variability of compression without degrading voltage standing wave ratio (VSWR) independent of the compression of the interconnect 100.

The first plunger portion 110a and/or any of the barrels 111b-f of the spring probes 110a-f can be movable or fixed relative to the support member 120. For example, the first plunger portion 110a and/or any of the barrels 111b-f can be threadedly coupled, adhesively coupled, or configured to have an interference fit with the support member 120 to secure the first plunger portion 110a and/or any of the barrels 111b-f to the support member 120.

The tips of the spring probes and the protrusion from the support member near the circuit board 103 are examples of instances where the characteristic impedance is not consistent with the nominal characteristic impedance for a given region, as determined based on the cross-sections of FIGS. 5A-5C. Similarly, although the lengths 133a, 134b-f of the first plunger portion 113a and the barrels 111b-f in the first region 141 are substantially equal, and the lengths 134a, 133b-f of the barrel 111a and the first plunger portions 113b-f in the first region 141 are substantially equal, slight variations in these lengths due to manufacturing tolerances may result in local instances where the characteristic impedance is not consistent with the nominal characteristic impedance for a given region. These variances from the nominal characteristic impedance can be adjusted or controlled based on the application. For example, a high frequency application may be less tolerant than a lower frequency application and therefore may necessitate tighter control on such local variations from the nominal characteristic impedance than for a lower frequency application. Thus, terms such as "substantially," "maintain," and "constant" when used in the context of component dimensions or characteristic impedance will be understood by one skilled in the art in light of the particular application of the coaxial electrical interconnect.

Figure 6:
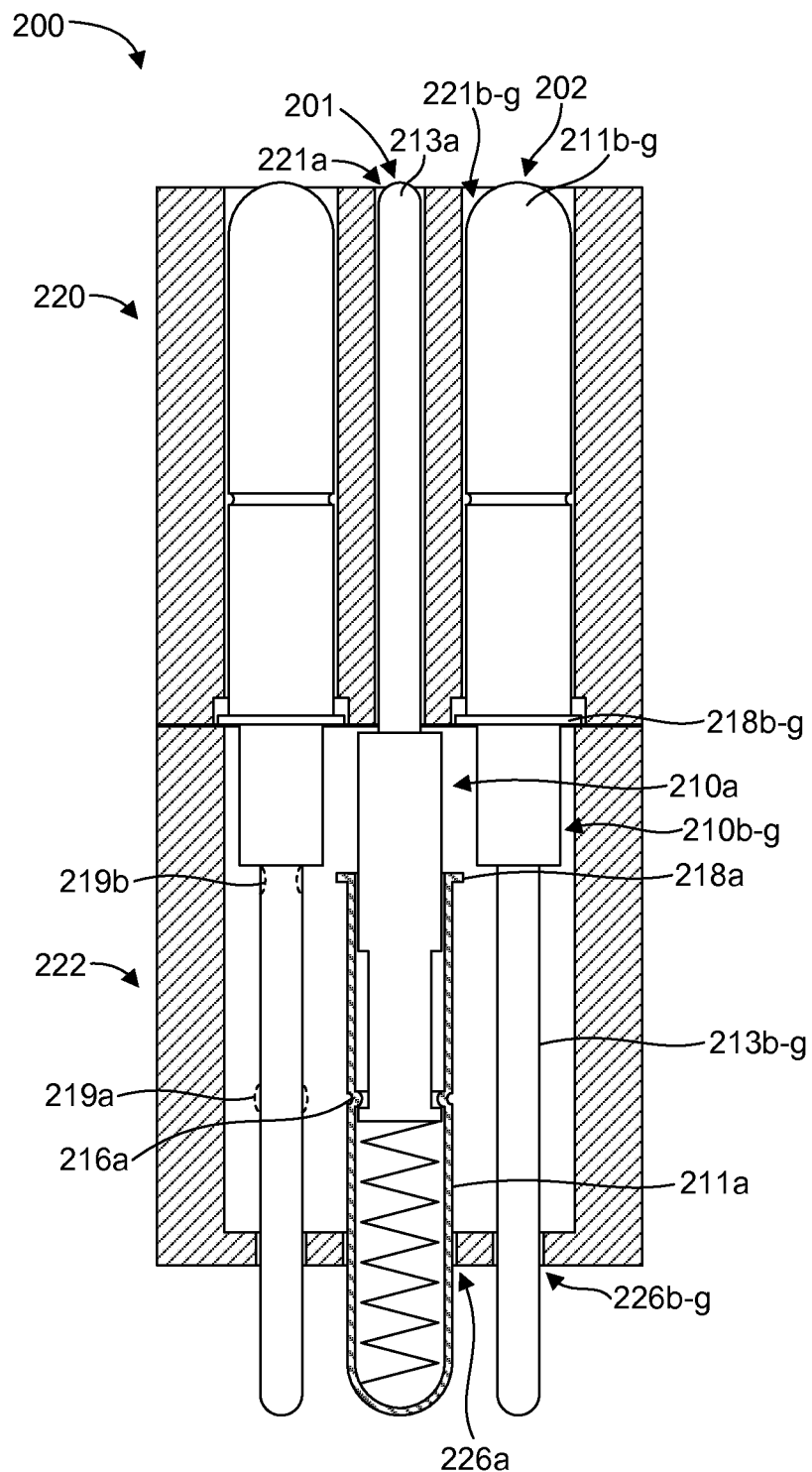
FIG. 6 is a coaxial electrical interconnect in accordance with another example of the present disclosure.

FIG. 6 illustrates a schematic cross-sectional view of a coaxial electrical interconnect 200 in accordance with another example of the present disclosure. The coaxial electrical interconnect 200 is similar to the coaxial electrical interconnect 100 discussed above in many respects. In this example, several features are illustrated that can facilitate capture or retention of spring probes and/or spring probe components as well as provide mechanical support for the spring probes. In this case, an inner conductor 201 can have a spring probe 211a and an outer conductor 202 can include six spring probes referred to collectively by reference nos. 210b-g. First plunger portion 213a of the spring probe 210a can be received in an opening 221a of a spring probe support member 220, and barrels 211b-g of the spring probes 210b-g can be received in openings 221b-g of the spring probe support member 220. The first plunger portion 213a and the barrels 211b-g and can be configured to move or slide relative to the spring probe support member 220 in the openings 221a-g, respectively. An additional spring probe support member 222 can be coupled to the spring probe support member 220 to capture or retain the spring probes 210a-g as well as to provide mechanical support for the spring probes. The spring probe support members 220, 222 are shown isolated in FIG. 7 and a representative spring probe 210 is shown isolated in FIG. 8.

The spring probe 210 can include a detent 216 in a barrel 211 to interface with a capture feature 217 of a second plunger portion 214 of a plunger 212 to maintain the plunger 212 at least partially within the barrel 211. The second plunger portion 214 and the detent 216 can be configured to provide a suitable range of motion for the plunger 212 relative to the barrel 211. The spring probe 210 can also include a capture feature 218, such as a flange on the barrel 211, to capture or retain the spring probe with the spring probe support members 220, 222. The spring probe support member 220 can include one or more recesses 223, such as a counter bore. The recess 223 can be configured to accommodate the capture features 218b-g on the barrels 211b-g of the outer conductor 202 spring probes 210b-g, as shown in FIG. 6. The spring probe support member 222 can have an inner diameter 224 configured to provide a mechanical interference with the capture features 218b-g of the barrels 211b-g in the recess 223, which can limit a range of motion for the barrels relative to the support member 220 and capture or retain the spring probes 210b-g of the outer conductor 202 with the spring probe support members 220, 222. The spring probe support member 222 can also have an end 225 with alignment openings 226a-g configured to receive the first plunger portions 213b-g of the spring probes 210b-g of the outer conductor 202 and the barrel 211a of the spring probe 210a of the inner conductor 201. The openings 226a-g can be sized to allow movement of the first plunger portions 213b-g and the barrel 211a relative to the spring probe support member 222 during compression of the interconnect 200, while providing adequate mechanical support for lateral deflection of the spring probes 210a-g. The opening 226a for the barrel 211a can also be configured to provide a mechanical interference with the capture feature 218a of the barrel 211a to capture or retain the spring probe 210a of the inner conductor 201 with the spring probe support members 220, 222. In one aspect, an outer portion or surface of the spring probe support member 220 and/or the spring probe support member 222 can comprise an overloading type of dielectric material (e.g., metalized plastic) to create a ground shield around the spring probes 210a-g.

Figures 7, 8:
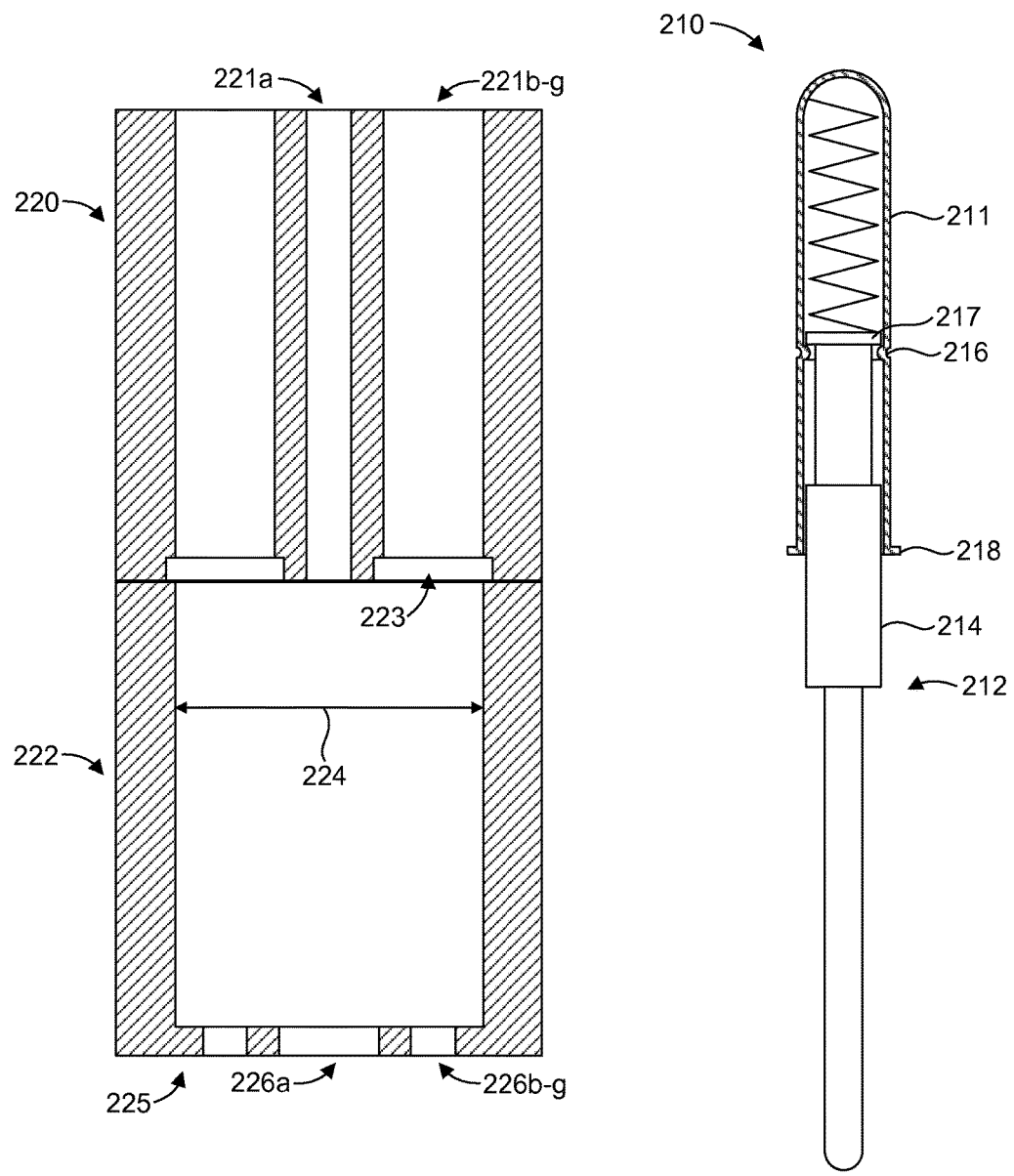
FIG. 7 is a support structure of the coaxial electrical interconnect of FIG. 6.
FIG. 8 is a spring probe of the coaxial electrical interconnect of FIG. 6.

The presence of the spring probe capture features 218a-g may introduce a slight impedance mismatch. For example, the flanges on the barrels 211a-g as well as the spring probe support member 222 can introduce material that can cause local variations in the nominal impedance of a given region. As mentioned above, these local variations in impedance can be reduced or minimized depending on the application to acceptable levels. For example, the interconnect 200 can be fine-tuned for higher frequency applications by including local diameter expansions 219a and/or contractions 219b in adjacent components to offset the presence or absence of material in a neighboring component (e.g., detent 216a and capture feature 218a). In one aspect, a material, such as a dielectric material, can be included strategically to address local impedance variations. As shown in FIGS. 6 and 7, the spring probe support member 222 can be hollowed out with a minimal amount of material at the end 225 to provide mechanical support for the spring probes 210a-g. In one aspect, the spring probe support member 222 can be configured with holes, suitable material type, etc. to approximate the resistance of air so that impedance is maintained within acceptable levels locally.

Figure 9:
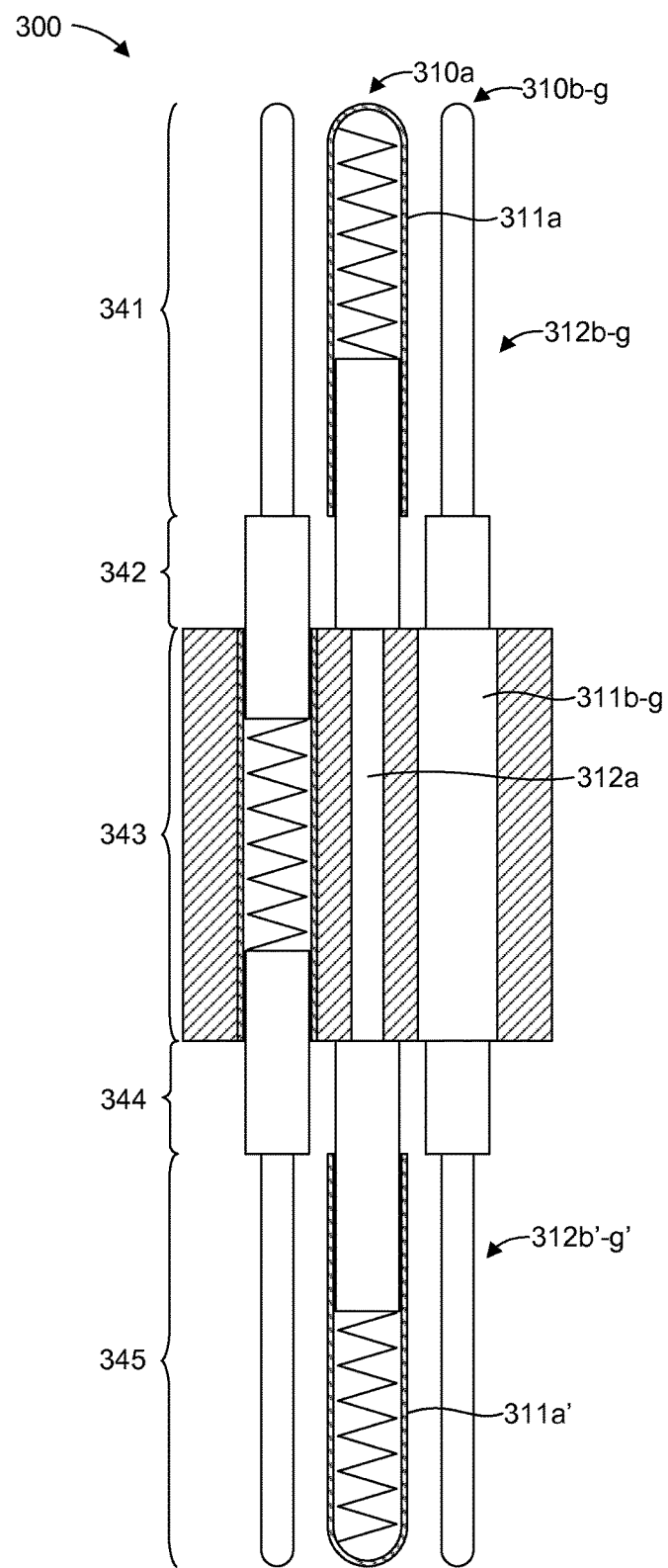
FIG. 9 is a coaxial electrical interconnect in accordance with yet another example of the present disclosure.

FIG. 9 illustrates a schematic cross-sectional view of a coaxial electrical interconnect 300 in accordance with yet another example of the present disclosure. The coaxial electrical interconnect 300 includes many similarities to the coaxial electrical interconnects 100 and 200 discussed above. In this example, the electrical interconnect 300 is configured with spring probes 310a-g that are double-ended, whereas the spring probes of the electrical interconnects 100 and 200 are single-ended. Thus, the spring probes 310a-g can compress independently on opposite ends of the interconnect 300. In this case, the spring probe 310a of an inner conductor 301 comprises two barrels 311a, 311a' oriented on opposite ends of a plunger 312a, and the spring probes 310b-g of an outer conductor 302 comprise two plungers 312b-g, 312b'-g' oriented on opposite ends of a barrel 311b-g. The spring probes 310a-g utilized in this example therefore are not all alike or identical. The result of such a configuration is five different regions 341-345, each of which can be configured to have a given nominal characteristic impedance, as described herein. It should be recognized that any suitable number of different regions can be utilized.

In accordance with one embodiment of the present invention, a method for facilitating a matched impedance electrical connection is disclosed. The method can comprise providing a coaxial electrical interconnect, having an inner conductor including an electrically conductive spring probe, and an outer conductor including a plurality of electrically conductive spring probes disposed about the inner conductor, each spring probe having a barrel and a plunger biased out of the barrel, the plunger having a first plunger portion external to the barrel and a second plunger portion disposed partially in the barrel, the first and second plunger portions having different diameters, wherein a barrel of the spring probe of the inner conductor is located proximate a plunger of at least one of the spring probes of the outer conductor. Additionally, the method can comprise facilitating a constant characteristic impedance of the electrical interconnect as the plungers move relative to the barrels. In one aspect of the method, facilitating a constant characteristic impedance can comprise sizing the first plunger portion of the spring probe of the inner conductor and the barrels of the spring probes of the outer conductor with substantially equal lengths. It is noted that no specific order is required in this method, though generally in one embodiment, these method steps can be carried out sequentially.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A coaxial electrical interconnect, comprising:
    an inner conductor including an electrically conductive spring probe; and
    a plurality of outer conductors including a plurality of electrically conductive spring probes disposed around the inner conductor,
    each spring probe having a barrel with a spring positioned to bias a plunger out of the barrel, the plunger having a first plunger portion external to the barrel and a second plunger portion disposed partially in the barrel, the first and second plunger portions having different diameters,
    wherein a barrel of the spring probe of the inner conductor is located proximate a plunger of at least one of the spring probes of the outer conductors; and
    wherein the spring probe of the inner conductor is inverted relative to the spring probes of the outer conductors.

2. The coaxial electrical interconnect of claim 1, wherein the spring probes of the inner and outer conductors are substantially identical.

3. The coaxial electrical interconnect of claim 1, wherein the spring probes of the outer conductor are disposed in a circular configuration about the spring probe of the inner conductor.

4. The coaxial electrical interconnect of claim 1, further comprising a spring probe support member configured to provide mechanical support for the spring probes of the inner and outer conductors.

5. The coaxial electrical interconnect of claim 4, wherein the spring probe support member is constructed of a dielectric material.

6. The coaxial electrical interconnect of claim 4, wherein the spring probe support member is engaged with the first plunger portion of the spring probe of the inner conductor and with the barrels of the spring probes of the outer conductor.

7. The coaxial electrical interconnect of claim 1, wherein the first plunger portion of the spring probe of the inner conductor and the barrels of the spring probes of the outer conductor are substantially equal in length to facilitate maintaining a characteristic impedance of the electrical interconnect as the plungers move relative to the barrels.

8. The coaxial electrical interconnect of claim 1, wherein the spring probe of the inner conductor and the plurality of spring probes of the outer conductor are sized and positioned relative to one another to provide a given characteristic impedance.

9. The coaxial electrical interconnect of claim 1, wherein a first region of the electrical interconnect comprises the first plunger portion of the spring probe of the inner conductor and the barrels of the spring probes of the outer conductor, a second region of the electrical interconnect comprises the second plunger portions of the spring probes of the inner and outer conductors, and a third region of the electrical interconnect comprises the barrel of the spring probe of the inner conductor and the first plunger portions of the spring probes of the outer conductor, and wherein the spring probes of the inner and outer conductors are sized and positioned relative to one another to provide given characteristic impedances for the first, second, and third regions.

10. The coaxial electrical interconnect of claim 9, wherein the given characteristic impedances of the first, second, and third regions are the same.

11. The coaxial electrical interconnect of claim 9, wherein the first region further comprises a dielectric support member configured to provide mechanical support for the spring probes of the inner and outer conductors.

12. A method for facilitating a matched impedance electrical connection, comprising:
    providing a coaxial electrical interconnect, having
    an inner conductor including an electrically conductive spring probe, and
    a plurality of outer conductors including a plurality of electrically conductive spring probes disposed around the inner conductor,
    each spring probe having a barrel with a spring positioned to bias a plunger out of the barrel, the plunger having a first plunger portion external to the barrel and a second plunger portion disposed partially in the barrel, the first and second plunger portions having different diameters, wherein a barrel of the spring probe of the inner conductor is located proximate a plunger of at least one of the spring probes of the outer conductors;

wherein the spring probe of the inner conductor is inverted relative to the spring probes of the outer conductors; and facilitating a constant characteristic impedance of the electrical interconnect as the plungers move relative to the barrels.

13. The method of claim 12, wherein facilitating a constant characteristic impedance comprises sizing the first plunger portion of the spring probe of the inner conductor and the barrels of the spring probes of the outer conductor with substantially equal lengths.

\* \* \* \* \*